United States Patent [19]
Enoki et al.

[11] Patent Number: 5,835,853
[45] Date of Patent: Nov. 10, 1998

[54] TWO BAND RECEIVER

[75] Inventors: Takashi Enoki; Fujio Sasaki, both of Yokohama, Japan

[73] Assignee: Matsushita Electric Industrial Co., Ltd., Japan

[21] Appl. No.: 769,749

[22] Filed: Dec. 20, 1996

[30] Foreign Application Priority Data

Jan. 12, 1996 [JP] Japan .................................... 8-020706

[51] Int. Cl.$^6$ ....................................................... H04B 1/18
[52] U.S. Cl. ..................................... 455/180.1; 455/189.1; 455/266
[58] Field of Search ..................................... 455/142, 143, 455/180.1, 180.2, 188.1, 188.2, 189.1, 190.1, 191.3, 132, 133, 272, 277.1, 277.2, 59, 266, 338, 339, 340

[56] References Cited

U.S. PATENT DOCUMENTS

| | | | |
|---|---|---|---|
| 4,115,737 | 9/1978 | Hongu et al. | 455/189.1 |
| 4,132,952 | 1/1979 | Hongu et al. | 455/188.1 |
| 4,419,768 | 12/1983 | Yamashita et al. | 455/190.1 |
| 5,020,147 | 5/1991 | Okanobu | 455/143 |
| 5,369,800 | 11/1994 | Takagi et al. | 455/59 |

FOREIGN PATENT DOCUMENTS

6132849  5/1994  Japan .

Primary Examiner—Nguyen Vo
Attorney, Agent, or Firm—Rossi & Associates

[57] ABSTRACT

A receiver comprises; an input TERM (11) for receiving a radio wave signal including at least one of 1st and 2nd radio wave components from an antenna; a 1st SW (12); a 1st BPF (13) for extracting the 1st radio wave component; a 2nd BPF (14) for extracting the 2nd radio wave component; a 2nd SW (17), the 1st and 2nd SW to selectively forming 1st and 2nd SIG passages through the 1st BPF in a 1st mode and the 2nd BPF in a 2nd mode respectively; a 1st LO (19) for generating 1st and 2nd LO SIGs (30a, 30b) in the 1st and 2nd modes respectively; a 1st mixer (18) for mixing an output of the 2nd SW with the 1st and 2nd LO SIGs in the 1st and 2nd modes respectively; a 1st FLT (21) for filtering an output of the 1st mixer to output 1st and 2nd IF SIGs having the same FRQ; a 2nd LO (22), 2nd mixer (23), a 2nd FLT (25) for generating 3rd and 4th IF SIGs corresponding to the 1st and 2nd radio wave components from an output of the 1st FLT in the 1st and 2nd modes, respectively. A receiver includes two sets of the receivers except 1st and 2nd LOs commonly used, which provides a diversity receiving. The receiver may further comprise a SW and another input coupled to another antenna. This SW provides another diversity receiving. A modified receiver provides a diversity receiving after an antenna and after detection.

33 Claims, 9 Drawing Sheets

FIG. 10

TWO BAND RECEIVER

BACKGROUND OF THE INVENTION

1. Field of the Invention

This invention relates to a two band receiver for receiving two bands of radio wave signals.

2. Description of the Prior Art

A first prior art portable receiver receives a radio wave of 800 MHz band and a second prior portable receiver receives a radio wave of 1.5 GHz band. The user uses first prior art portable receiver when the user desires to receive the radio wave of 800 MHz band and the user uses second prior art portable receiver when the user desires to receive the radio wave of 1.5 GHz band. Therefore, two relievers are necessary.

SUMMARY OF THE INVENTION

The aim of the present invention is to provide an improved two band receiver.

According to the present invention, a first receiver is provided, which comprises; an input terminal for receiving a radio wave signal including at least one of first and second radio wave components from an antenna; a first switch; a first band pass filter for band-pass-filtering the radio wave signal from the first switch and extracting the first radio wave component; a second band pass filter for band-pass-filtering the radio wave signal from the first switch and extracting the second radio wave component; a second switch, the first and second switch selectively forming first and second signal passages through the first band pass filter in a first mode and the second band pass filter in a second mode respectively; a first local oscillator for generating first and second local oscillation signals in the first and second modes respectively; a first mixer for mixing an output of the second switch with the first and second local oscillation signals in the first and second modes respectively; a first filter for filtering an output of the first mixer to output first and second intermediate frequency signals corresponding to the first and second radio wave components in the first and second modes, respectively, the first and second local oscillation signal being generated such that the first and second intermediate frequency signals have the same intermediate frequency; a second local oscillator for generating a third local oscillation signal; a second mixer for mixing an output of the first filter with the third local oscillation signal; and a second filter for filtering an output of the second mixer to output third and fourth intermediate frequency signals corresponding to the first and second radio wave components in the first and second modes, respectively.

In the first receiver, the first local oscillator may comprise a first frequency synthesizer for generating the first local oscillation signal, a second frequency synthesizer for generating the second local oscillation signal, and a switch for outputting the first and second local oscillation signals in the first and second modes respectively.

In the first receiver, the first local oscillator may comprise a first frequency synthesizer for generating the first local oscillation signal, a third mixer for mixing the first oscillation signal with the third local oscillation signal to provide the second oscillation signal, and a third switch for outputting the first and second local oscillation signals in the first and second modes respectively. Moreover, a fourth switch for supplying the first oscillation signal to the third switch in the first mode and to the third mixer in the second mode and a fifth switch for supplying a supply power to the third mixer in the second mode may be further comprised.

The first receiver may further comprise an amplifier provided between the second switch and the first mixer for amplifying the output of the second switch.

The first receiver may further comprise; a first amplifier provided between the first bandpass filter and the second switch for amplifying an output of the first band pass filter and a second amplifier provided between the second bandpass filter and the second switch for amplifying an output of the second band pass filter. Moreover, a third filter for filtering an output of the first amplifier and a fourth filter for filtering an output of the second amplifier may be further provided.

The first receiver may further comprise an amplifier provided between the first filter and the second mixer for amplifying an output of the first filter.

According to this invention a second receiver is provided, which comprises; a first local oscillator for generating first and second local oscillation signals in first and second modes respectively; a second local oscillator for generating a third local oscillation signal; and first and second receiving circuits. Each includes: an input terminal for receiving a radio wave signal including at least one of first and second radio wave components from an antenna; a first switch; a first band pass filter for band-pass-filtering the radio wave signal from the first switch and extracting the first radio wave component; a second band pass filter for band-pass-filtering the radio wave signal from the first switch and extracting the second radio wave component; a second switch, the first and second switch to selectively forming first and second signal passages through the first band pass filter in a first mode and the second band pass filter in a second mode respectively; a first mixer for mixing an output of the second switch with first and second local oscillation signals in the first and second modes respectively; a first filter for filtering an output of the first mixer to output first and second intermediate frequency signals in the first and second modes, respectively, the first and second local oscillation signal being generated such that the first and second intermediate frequency signals have the same intermediate frequency; a second mixer for mixing an output of the first filter with the third local oscillation signal; and a second filter for filtering an output of the second mixer to output third and fourth intermediate frequency signals in the first and second modes, respectively, wherein the second filters of the first and second receivers provides output interference signals of diversity receiving.

In the second receiver, each of the receiving circuits may further comprise a first amplifier provided between the first bandpass filter and the second switch for amplifying an output of the first band pass filter and a second amplifier provided between the second bandpass filter and the second switch for amplifying an output of the second band pass filter.

In the second receiver, each of the receiving circuits may further comprise an amplifier provided between the second switch and the first mixer for amplifying the output of the second switch.

In the second receiver, each of the receiving circuits may further comprise a third filter for filtering an output of the first amplifier and a fourth filter for filtering an output of the second amplifier.

In the second receiver, each of the receiving circuit may further comprise an amplifier provided between the first filter and the second mixer for amplifying an output of the first filter.

A third receiver comprises, in addition to the structure of the first receiver, a second input terminal for receiving a second radio wave signal including the first and second radio wave components from another antenna and a third switch for supplying either of the radio wave signal or the second radio wave signal to the first switch in response to an antenna switching signal, wherein the supplying either of the radio wave signal or the second radio wave provides a diversity receiving.

The third receiver may further comprise an amplifier provided between the second switch and the first mixer for amplifying the output of the second switch. Moreover, it may further comprise a first amplifier between the first bandpass filter, the second switch for amplifying an output of the first band pass filter, a second amplifier provided between the second bandpass filter, and the second switch for amplifying an output of the second band pass filter. Moreover, a third filter for filtering an output of the first amplifier and a fourth filter for filtering an output of the second amplifier may be further provided.

The third receiver may further comprise an amplifier provided between the first filter and the second mixer for amplifying an output of the first filter.

According to this invention, a fourth receiver is provided, which comprises: a first input terminal for receiving a first radio wave signal including at least one of first and second radio wave components from an antenna; a first switch receiving the first radio wave signal from the first input terminal; a second input terminal for receiving a second radio wave signal including at least one of the first and second radio wave components from another antenna; a second switch receiving the second radio wave signal from the second input terminal; a first band pass filter for band-pass-filtering the first radio wave signal from the first switch and extracting the first radio wave component in a first mode; a third switch receiving the first and second radio wave signals from the first and second switches respectively in second mode and outputting either of the first or second radio wave signal in response to an antenna switching signal in the second mode; a second band pass filter for band-pass-filtering an output of the third switch and extracting the second radio wave component; a fourth switch, the first and fourth switches forming a first passage through the first band pass filter in the first mode, the third and fourth switch forming a second passage through the second band pass filter in the second mode; a first local oscillator for generating first and second local oscillation signals in the first and second modes respectively; a first mixer for mixing an output of the second switch with the first and second local oscillation signals in the first and second modes respectively; a first filter for filtering an output of the first mixer to output first and second intermediate frequency signals in the first and second modes, respectively, the first and second local oscillation signal being generated such that the first and second intermediate frequency signals have the same intermediate frequency; a second local oscillator for generating a third local oscillation signal; a second mixer for mixing an output of the first filter with the third local oscillation signal; a second filter for filtering an output of the second mixer to output third and fourth intermediate frequency signals in the first and second modes, respectively; a third band pass filter for band-pass-filtering the second radio wave signal from the second switch and extracting the first radio wave component, the second switch supplying the second radio wave signal to the third band pass filter in the first mode; a third mixer for mixing an output of the third band pass filter with the first local oscillation signal in the first mode; a second filter for filtering an output of the third mixer to output third intermediate frequency signal in the first mode; a fourth mixer for mixing an output of the second filter with the third local oscillation signal; and a second filter for filtering an output of the fourth mixer to output a fourth intermediate frequency signal in the first mode.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described a first embodiment of this invention.

Figure 1:
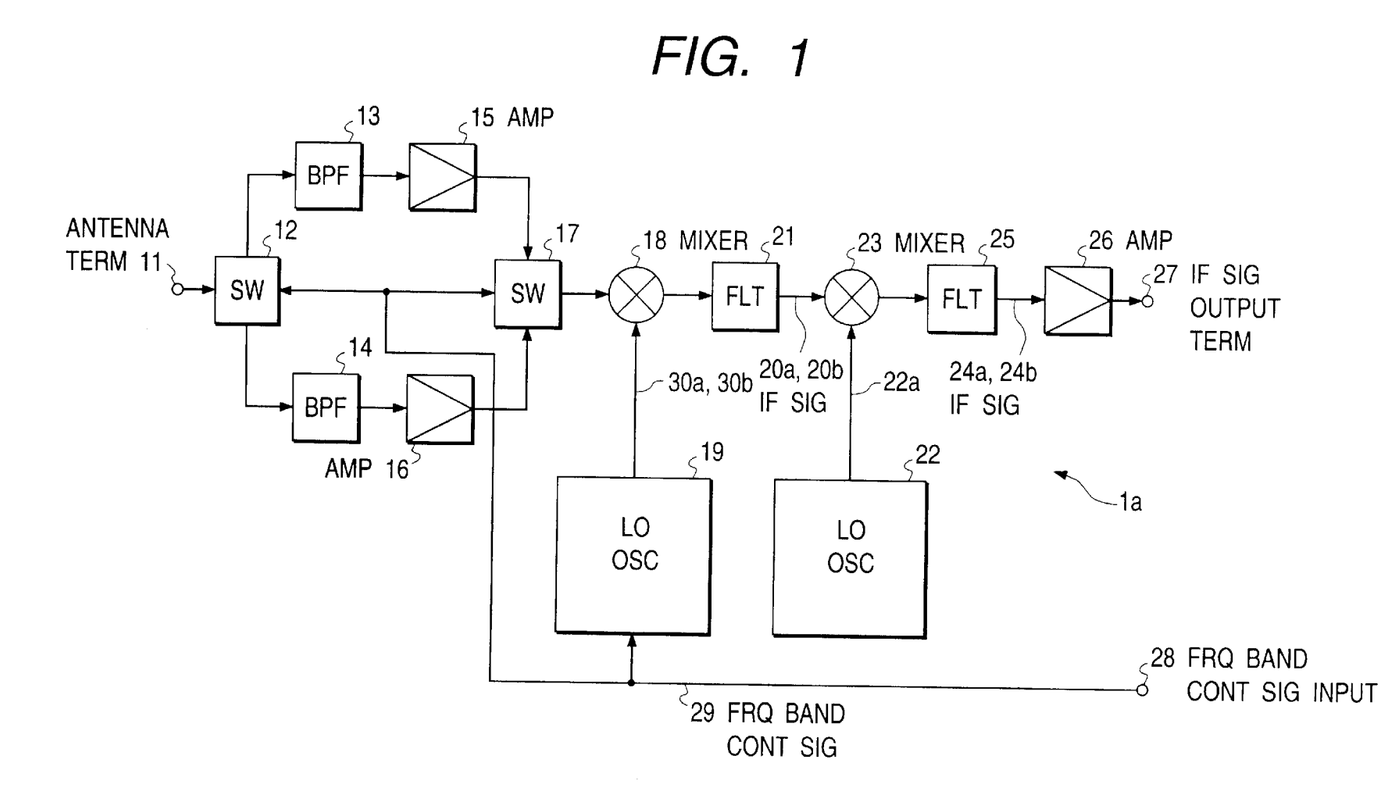
FIG. 1 is a block diagram of a receiver of a first embodiment of this invention.

FIG. 1 is a block diagram of a receiver of the first embodiment of this invention.

The receiver of the first embodiment comprises an antenna terminal 11 for receiving a radio wave signal including at least one of first and second radio wave components from an antenna (not shown), a first switch 12, a first band pass filter 13 having a first center frequency corresponding the first radio wave component, for band-pass-filtering the radio wave signal from the first switch to extract the first radio wave component, a second band pass filter 14 having a second center frequency corresponding the second radio wave component for band-pass-filtering the radio wave signal from the first switch 12 to extract the second radio wave component, a second switch 17, the first and second switches 12 and 17 responsive to a frequency band control signal 28 selectively forming first and second signal passages through the first band pass filter 13 in a first mode and the second band pass filter 14 in a second mode respectively, a first local oscillator 19 for generating first and second local oscillation signals 30$a$ and 30$b$ in the first and second modes, respectively, a first mixer 18 for mixing an output of the second switch 17 with the first and second local oscillation signals 30$a$ and 30$b$ in the first and second modes respectively, a first filter 21 for filtering an output of the mixer 18 to output first and second intermediate frequency signals 20$a$ and 20$b$ in first and second modes, respectively, the first and second local oscillation signals being generated such that the first and second intermediate frequency signals 20a and 20b having the same intermediate frequency, a second local oscillator 22 for generating a third local oscillation signal 22a, a second mixer 23 for mixing an output of the first filter 21 with the third local oscillation signal 22a; and a second filter 25 for filtering an output of the second mixer to output third and fourth intermediate frequency signals 24a and 24b in the first and second modes, respectively. The third and fourth intermediate frequency signals are amplified by an amplifier 26 to provide an output of this receiver from the third and fourth intermediate frequency signals in the first and second modes. The frequency band control signal 29 indicates the first and second modes.

Figure 2:
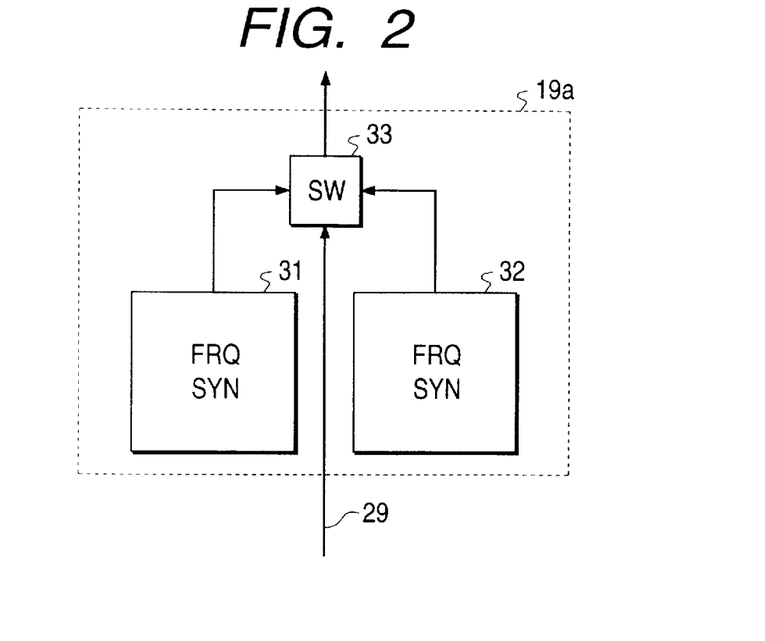
FIG. 2 is a partial block diagram of a receiver of the first embodiment.

FIG. 2 is a partial block diagram of the receiver of this embodiment.

The first local oscillator 19 (19a) comprises a frequency synthesizer 31 for generating the first local oscillation signal 30a, a frequency synthesizer 32 for generating the second local oscillation signal 30b, and a switch 33 for outputting the first and second local oscillation signals 30a and 30b in the first and second modes respectively in response to the frequency band control signal 29.

An operation will be described.

The radio wave signal including at least one of the first and second radio wave components from the antenna is supplied to the first switch 12. The first band pass filter 13 has the first center frequency corresponding the first radio wave component to extract the first radio component from the radio wave signal from the first switch 12. The second band pass filter 14 has the second center frequency corresponding the second radio wave component to extract the second radio component from the second radio wave signal from the first switch 12. The first and second switches 12 and 17 selectively forms the first and second signal passages through the first band pass filter 13 in a first mode and the second band pass filter 14 in a second mode respectively in response to the frequency band control signal 29.

The first local oscillator 19 generates first and second local oscillation signals 30a and 30b in the first and second modes, respectively in response to the frequency band control signal 29. The first mixer 18 mixes the output of the second switch 17 with the first and second local oscillation signals 30a and 30b in the first and second modes respectively. The first filter 21 filters the output of the first mixer 18 to suppress unnecessary components, such as frequency adding components, to output first and second intermediate frequency signals (frequency different components) 20a and 20b in first and second modes, respectively. The first and second local oscillation signals are generated such that the first and second intermediate frequency signals 20a and 20b has the same intermediate frequency.

The second local oscillator 22 fixedly generates the third local oscillation signal 22a and the second mixer 23 mixes the output of the first filter 21 with the third local oscillation signal 22a. The second filter 25 filters the output of the second mixer 23 to output third and fourth intermediate frequency signals 24a and 24b in the first and second modes, respectively. The third and fourth intermediate frequency signals are amplified by the amplifier 26 to provide an output of this pager from the third and fourth intermediate frequency signals in the first and second modes.

As mentioned, the local oscillation frequency of the first local oscillator 19 is changed to provide the first and second intermediate frequency signals having the same frequency in accordance with the desired frequency band, so that the circuits after the mixer 18 are commonly used.

A second embodiment will be described.

Figure 3:
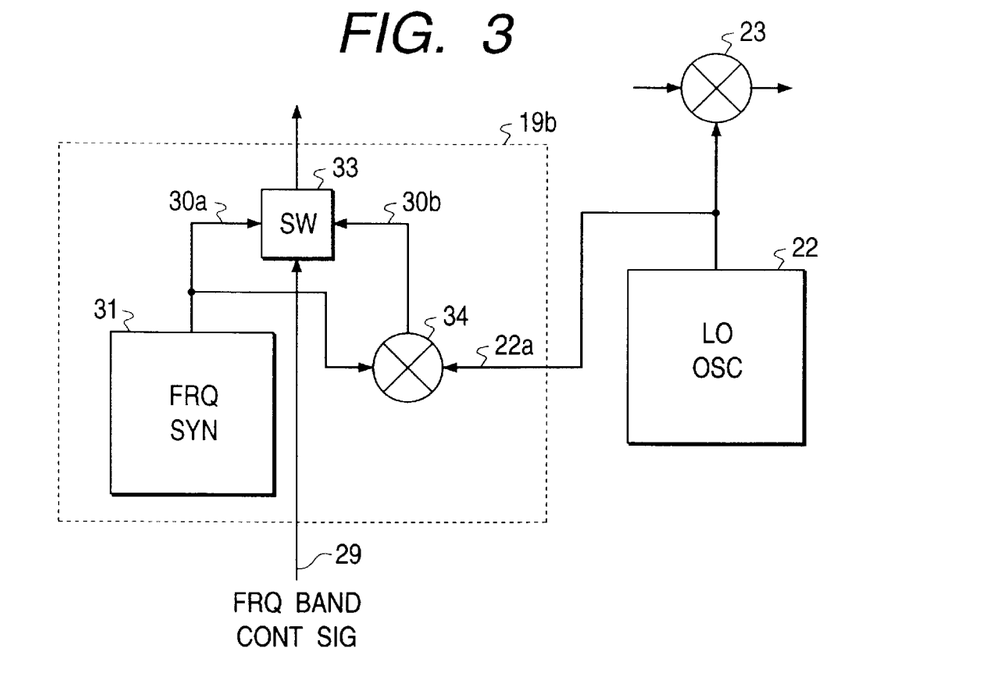
FIG. 3 is partial block diagram of a receiver of a second embodiment showing a local oscillation circuit.

A receiver of the second embodiment has substantially the same structure and operation as the receiver of the first embodiment. FIG. 3 is a partial block diagram of the receiver of the second embodiment. The difference is in the first local oscillation circuit 19. In this embodiment, the first local oscillation signal is generated by the frequency synthesizer 31 as similar to the first embodiment. However, the second local oscillation signal is generated by a mixer 34 for mixing the first local oscillation signal with the third local oscillation frequency signal 22a to generate the second local oscillation frequency signal 30b. Therefore, the local oscillation frequency of the third local oscillation signal is determined in consideration of the frequency difference between the first and second radio wave components.

As mentioned, in the receiver of the second embodiment, the second frequency synthesizer 32 used in the first embodiment is replaced by the mixer 34, so that the circuit configuration can be made small.

A third embodiment will be described.

Figure 4:
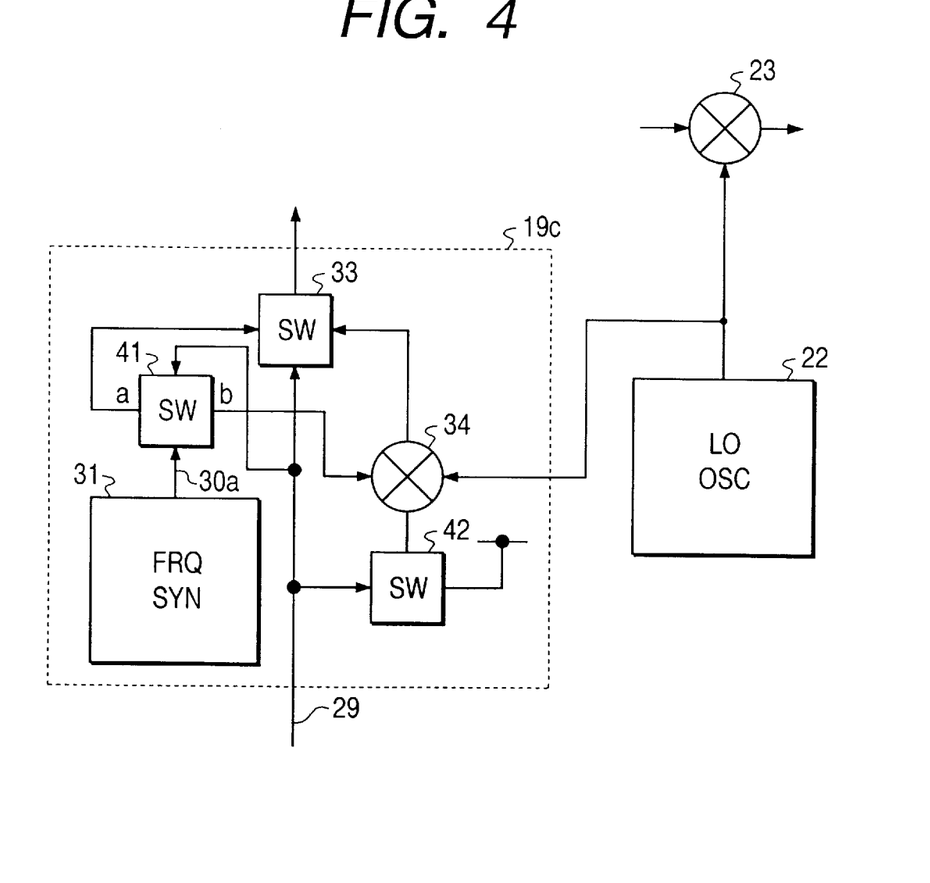
FIG. 4 is a partial block diagram of a third embodiment showing another local oscillation circuit.

A receiver of the second embodiment has substantially the same structure and operation as the receiver of the second embodiment. The difference is in the first local oscillation circuit 19. FIG. 4 is a partial block diagram of the fourth embodiment showing the local oscillation circuit 19c. The local oscillation circuit 19c of the third embodiment comprises, in addition to the structure of the first local oscillation circuit 19b, a switch 41 for transferring the first local oscillation signal to the switch 33 in the first mode and to the mixer 34 in the second mode and a switch 42 for supplying a supply power to the mixer 34 in the second mode in response to the frequency band control signal 29.

In the first mode, the first local oscillation signal 30a is supplied to the mixer 18 via the switch 41 and the switch 33 and is not supplied to the mixer 34. Further, the mixer 34 is not supplied with the supply power in the first mode. Therefore, the second local oscillation signal which was generated in the first and second modes in the second embodiment is not generated in the first mode in the third embodiment, so that a deterioration in a spurious response characteristic developed in accordance with the isolation characteristic of the switch 33 can be prevented.

In the second mode, the first local oscillation signal is supplied to the mixer 34 which is supplied with the supply power and generates the second local oscillation signal 30b which is supplied to the mixer 18 via the switch 33. The first local oscillation signal 30a is isolated from the line connected to the switch 33 to the mixer 18 by the switches 33 and 41. Therefore, the deterioration in a spurious response characteristic developed in accordance with the isolation characteristic of the switch 33 can be also prevented. Moreover, a power consumption of the mixer 34 can be reduced in the first mode.

A fourth embodiment will be described.

Figure 5:
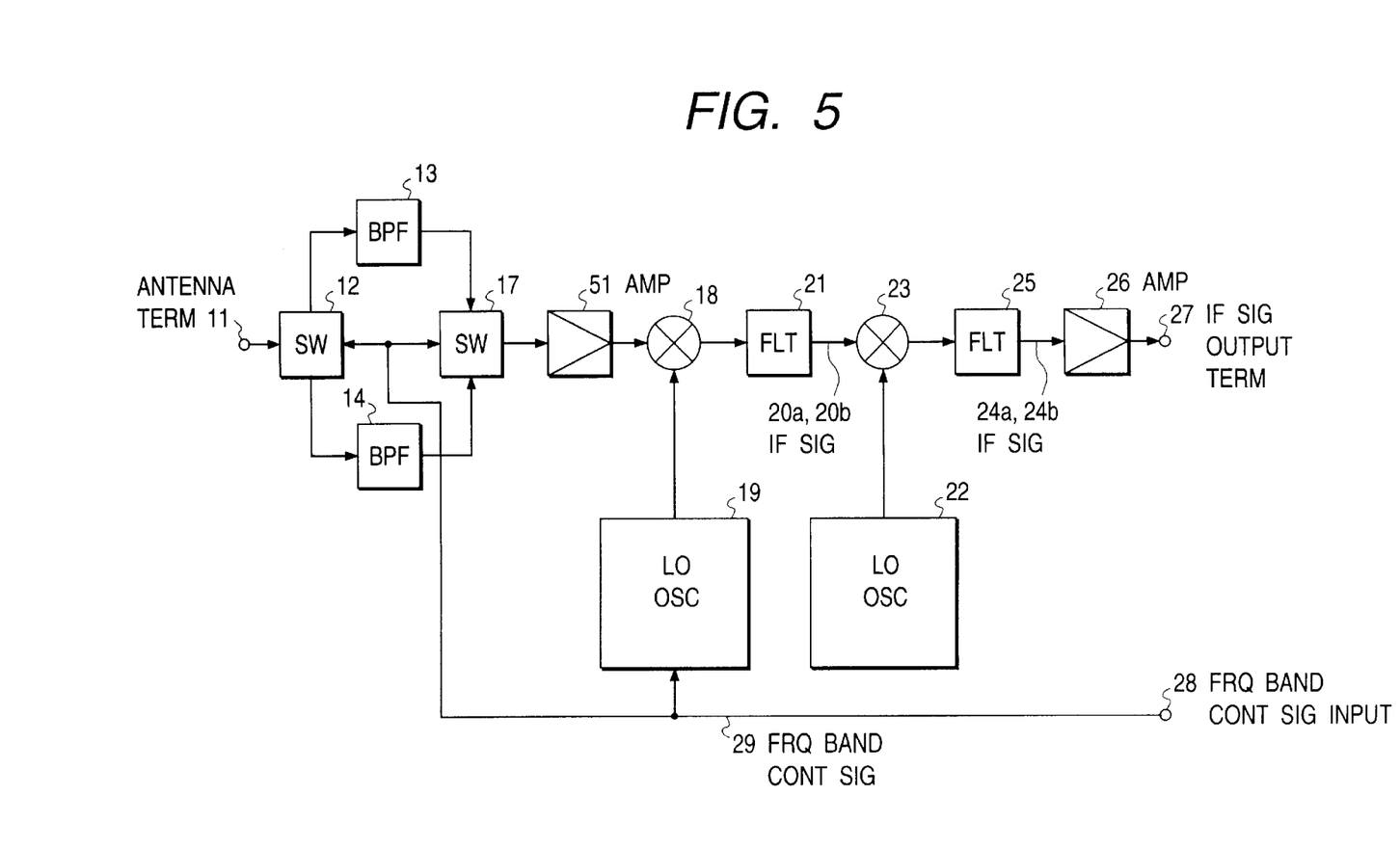
FIG. 5 is a block diagram of a receiver of a fourth embodiment.

FIG. 5 is a block diagram of a receiver of the fourth embodiment.

A receiver of the fourth embodiment has substantially the same structure and operation as the receiver of the first embodiment. The difference is in that the amplifiers 15 and 16 in the first embodiment are omitted and, instead, an amplified 51 is provided between the switch 17 and mixer 18. The amplifier 51 has a broad band or two bands characteristic. Therefore, the number of the amplifies can be reduced.

A fifth embodiment will be described.

Figure 6:
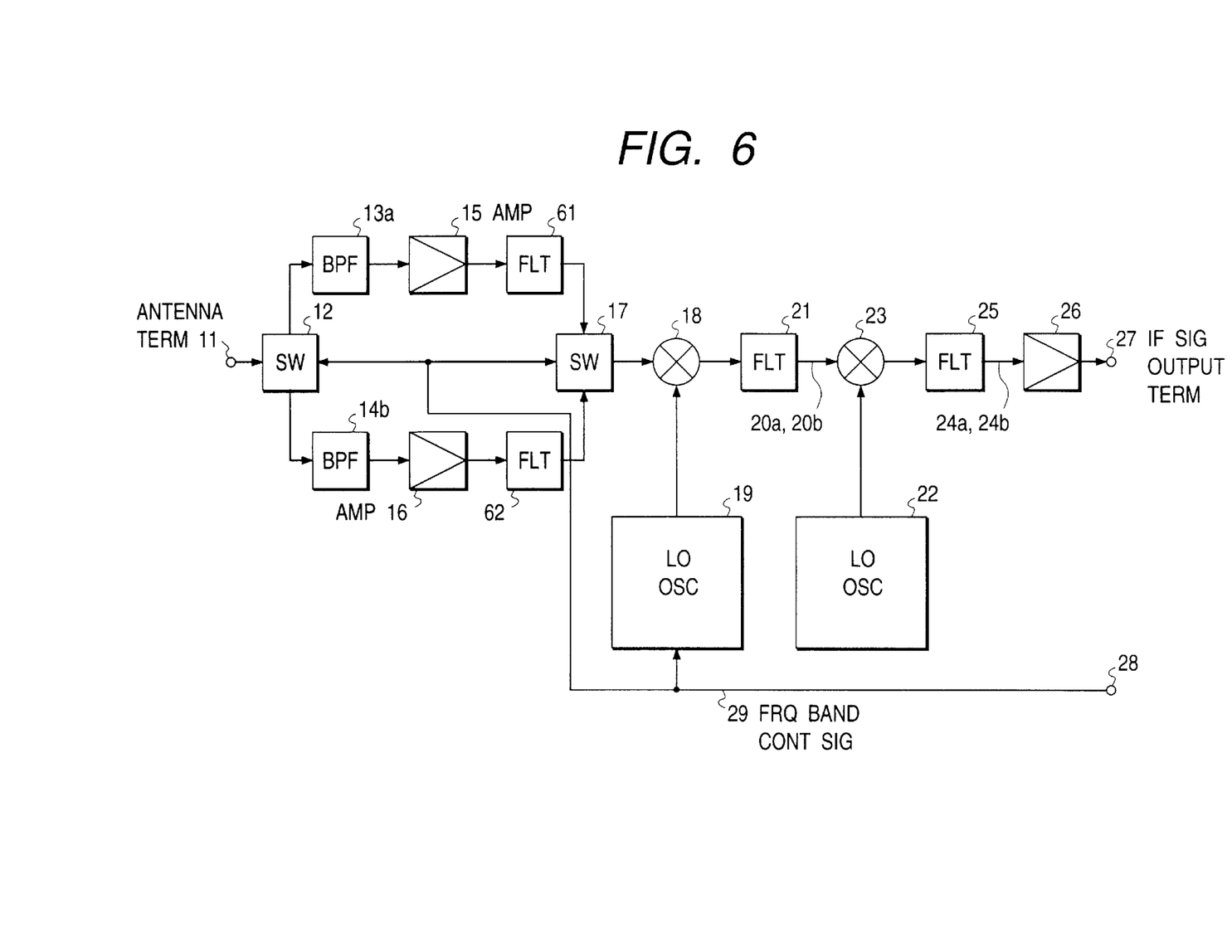
FIG. 6 is a block diagram of a receiver of a fifth embodiment.

FIG. 6 is a block diagram of a receiver of the fifth embodiment.

A receiver of the fifth embodiment has substantially the same structure and operation as the receiver of the first embodiment. The difference is in that filters 61 and 62 are provided between the amplifier 15 and the switch 17 and between the amplifier 16 and the switch 17 respectively in addition to the structure of the first embodiment. Then, though the number of the filters increases, the attenuation characteristics required for the filters 13, 14, 61, and 62 are moderated, so that these filters can be relatively miniaturized and a total cost is reduced. Further, the miniaturization of the filters increases a degree of freedom in the arrangement of elements in the assembly of the receiver.

A sixth embodiment will be described.

Figure 7:
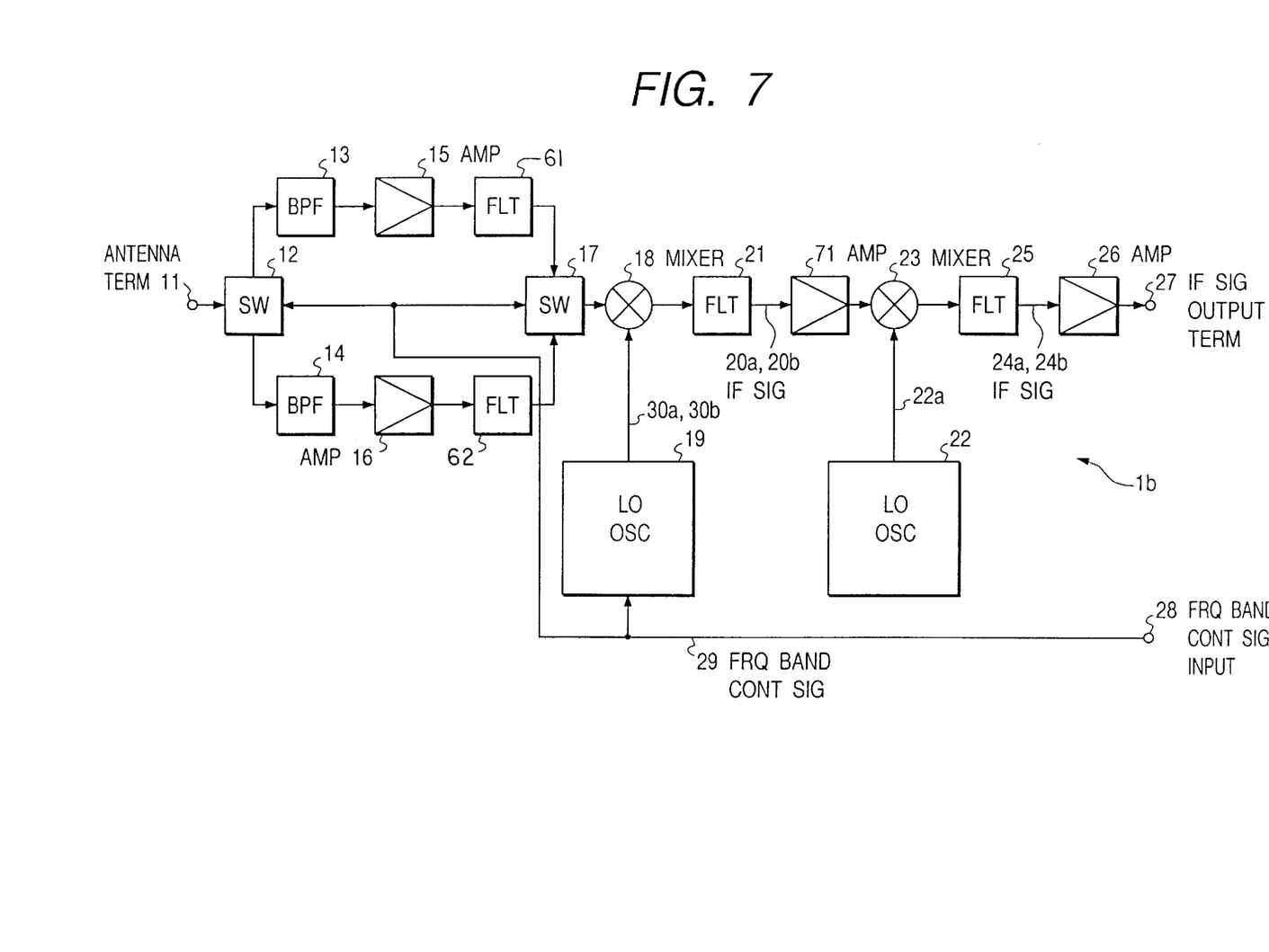
FIG. 7 is a block diagram of a receiver of a sixth embodiment.

FIG. 7 is a block diagram of a receiver of the sixth embodiment.

A receiver of the sixth embodiment has substantially the same structure and operation as the receiver of the first embodiment. The difference is in that an amplifier 71 is further provided between the filter 21 and the mixer 23.

The amplifier 71 has a relative high isolation characteristic, so that a load change to the filter 21 can be prevented. More specifically, if a strong electric field enters the antenna, the mixer 23 may saturate, so that a load condition of the filter 21 varies. Therefore, a receiving characteristic may be reduced due to a deterioration in the group delay characteristics or the like of the filter 21. Then, the amplifier 71 having the high isolation characteristic reduces an affection to the filter 21 by the load variation in the circuits after the mixer 23.

A seventh embodiment will be described.

Figure 8:
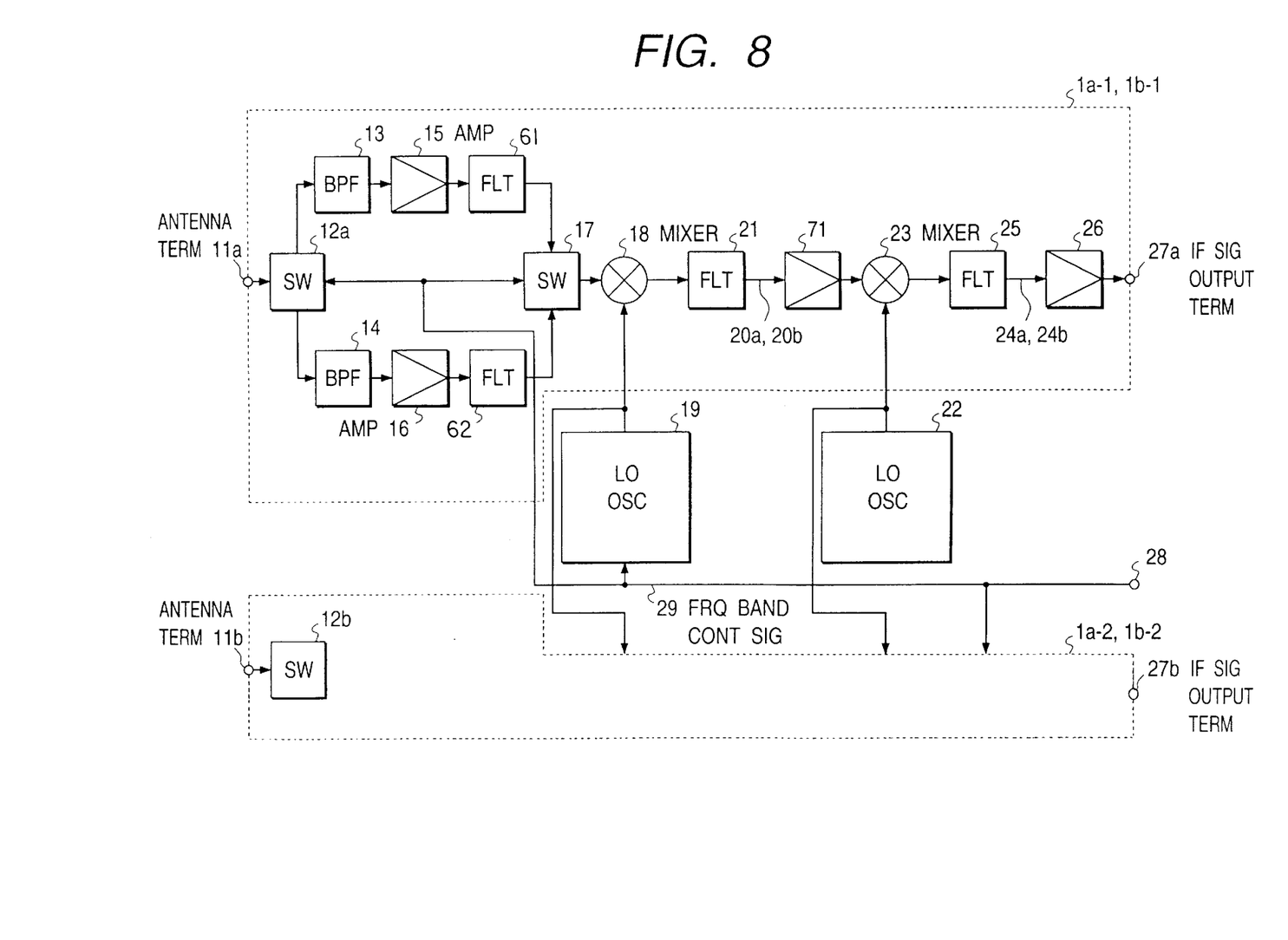
FIG. 8 is a block diagram of a receiver of a seventh embodiment.

FIG. 8 is a block diagram of a receiver of the seventh embodiment.

A receiver of the seventh embodiment has a similar structure and operation to the receiver of the seventh embodiment. That is, the receiver of the seventh embodiment has a first receiving circuit 1a for receiving a first radio wave signal from a first antenna (not shown) and a second receiving circuit 1b for receiving a second radio wave signal from a second antenna (not shown) which is arranged to have a suitable distance from the first antenna, and the local oscillators 19 and 22. This circuit provides a diversity receiving.

The receiver of the seventh embodiment provides a favorable receiving characteristic even though it encounters a phasing condition. In this embodiment, the circuit in the seventh embodiment is used for each of the receiving circuit. However, the circuits from the first to sixth embodiments can be used also.

An eighth embodiment will be described.

Figure 9:
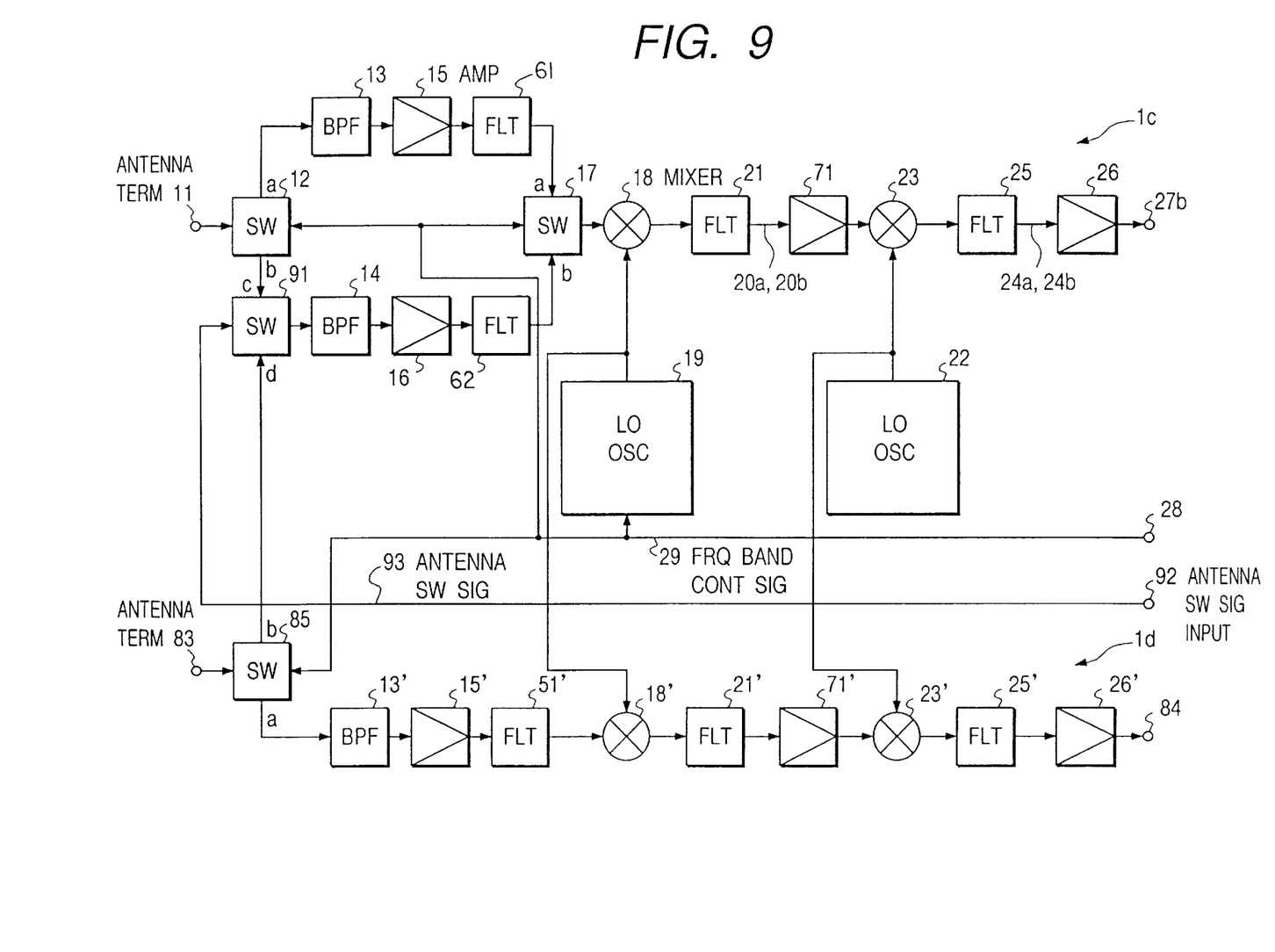
FIG. 9 is a block diagram of a receiver of an eighth embodiment.

FIG. 9 is a block diagram of a receiver of the eight embodiment.

A receiver of the eighth embodiment has a common structure as the receiver of the seventh embodiment. That is, the band pass filter 14, the amplifier 16, and the filter 62, and the switch 17 in the receiving circuit 1b provided in the seventh embodiment are omitted. On the other hand, a switch 91 is further provided between the switch 12 and the band pass filter 14. The switch 91 outputs either of the output of the switch 12 or the output of the switch 85 provided between an antenna terminal and a band pass filter 13' of the receiving circuit 1d in response to an antenna switching signal 92. When this receiver receives the first radio wave component, the first radio wave component is received by two signal passages to provide a diversity receiving with selecting one on passages after detection. When this receiver receives the second radio wave component, the second component is received by two antennas and the received second component is selected by the switch 91 to provide a diversity receiving with selection after the antenna receiving.

More specifically, when the receiver receives the first radio wave component, the switch 12, the switch 17, and the switch 85 is turned to the sides "a". Then, the first radio wave component from the first antenna (not shown) is processed by the signal passage including the band pass filter 13 and the mixer 18 via the switches 12 and 17 and its intermediate frequency output is provided at the intermediate frequency output terminal 27b. The first radio wave component from the second antenna (not shown) is processed by the signal passage including the band pass filter 13' and the mixer 18' via the switch 85 and its intermediate frequency output is provided at the intermediate frequency output terminal 84.

When the receiver receives the second radio wave component, the switch 12, the switch 17, and the switch 85 is turned to the sides "b". The switch 91 is turned to either of the side "c" or "d" in response to the antenna switching signal 92. Then, either of the radio wave signals from the first and second antennas (not shown) is supplied to the signal passage including the band pass filter 14 and the mixer 18 via the switches 91 and 17 and its intermediate frequency output is provided at the intermediate frequency output terminal 27b. That is, the second radio wave component is processed through only one signal passage in this embodiment.

As mentioned, according to the eighth embodiment, when the first radio wave component is processed by two signal passages and the diversity receiving with selection after detection is provided. When the second radio wave components received by the first and second antennas are selected and processed by one signal passage, so that the diversity receiving with selection after antenna receiving is provided.

A tenth embodiment will be described.

Figure 10:
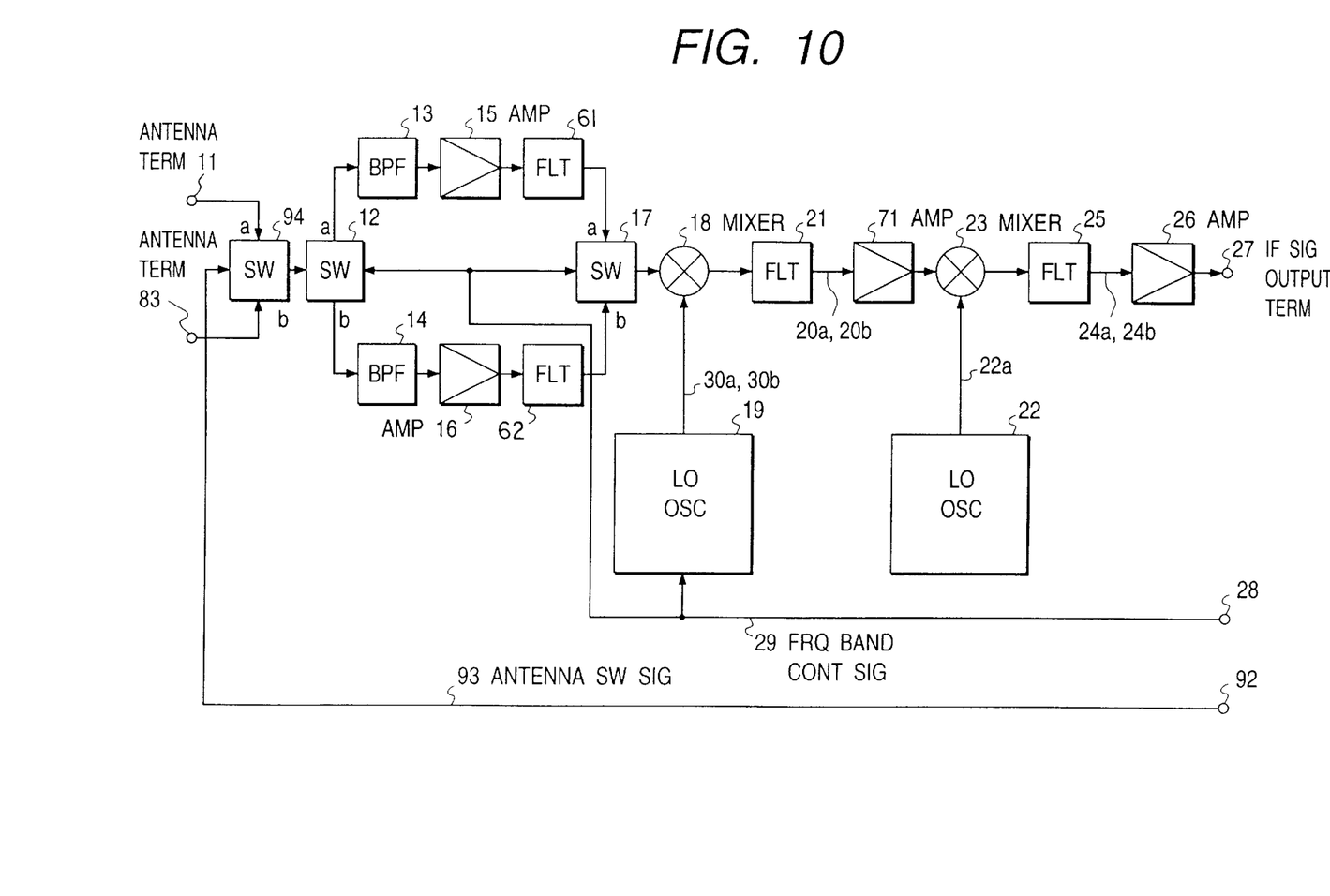
FIG. 10 is a block diagram of a receiver of a tenth embodiment.

FIG. 10 is a block diagram of a receiver of the tenth embodiment.

A receiver of the tenth embodiment has substantially the same structure and operation as the receiver of the sixth embodiment. The difference is in that a switch 94 selectively supplying radio wave signal from the first and second antennas (not shown) in response to an antenna switching signal 93. The switch 94 supplies either of the radio wave signal to the switch 12 from the first or the second antenna in response to the antenna switching signal 92, so that a diversity receiving with a selection after antenna receiving is provided. The switch 12 is switched in accordance with the frequency band control signal 29 for receiving as similar to the sixth embodiment. This structure provides a favourable receiving at the first and second frequency bands even in a phasing condition.

In this embodiment the switch and the antenna terminal 83 are provided in addition to the structure of the first embodiment. However, this structure can be applied to the second to sixth embodiment also.

What is claimed is:

1. A receiver comprising:

an input terminal for receiving a radio wave signal including at least one of first and second radio wave components from an antenna;

first switch;
a first band pass filter for band-pass-filtering said radio wave signal from said first switch and extracting said first radio wave component;
a second band pass filter for band-pass-filtering said radio wave signal from said first switch and extracting said second radio wave component;
a second switch, said first and second switch selectively forming first and second signal passages through said first band pass filter in a first mode and said second band pass filter in a second mode respectively;
a first local oscillator for generating first and second local oscillation signals in said first and second modes respectively;
a first mixer for mixing an output of said second switch with said first and second local oscillation signals in said first and second modes respectively;
a first filter for filtering an output of said first mixer to output first and second intermediate frequency signals corresponding to said first and second radio wave components in said first and second modes, respectively, said first and second local oscillation signal being generated such that said first and second intermediate frequency signals have the same intermediate frequency;
a second local oscillator for generating a third local oscillation signal;
a second mixer for mixing an output of said first filter with said third local oscillation signal; and
a second filter for filtering an output of said second mixer to output third and fourth intermediate frequency signals corresponding to said first and second radio wave components in said first and second modes, respectively, wherein said first local oscillator comprises a first frequency synthesizer for generating said first local oscillation signal, a third mixer for mixing said first oscillation signal with said third local oscillation signal to provide said second oscillation signal, and a third switch for outputting said first and second local oscillation signals in said first and second modes respectively.

2. A receiver as claimed in claim 1, wherein said first local oscillator comprises a first frequency synthesizer for generating said first local oscillation signal, a second frequency synthesizer for generating said second local oscillation signal, and a switch for outputting said first and second local oscillation signals in said first and second modes respectively.

3. A receiver as claimed in claim 1, further comprising a fourth switch for supplying said first oscillation signal to said third switch in said first mode and to said third mixer in said second mode and a fifth switch for supplying a supply power to said third mixer in said second mode.

4. A receiver as claimed in claim 3, further comprising an amplifier provided between said second switch and said first mixer for amplifying said output of said second switch.

5. A receiver as claimed in claim 3, further comprising a first amplifier provided between said first bandpass filter and said second switch for amplifying an output of said first band pass filter and a second amplifier provided between said second bandpass filter and said second switch for amplifying an output of said second band pass filter.

6. A receiver as claimed in claim 3, further comprising an amplifier provided between said first filter and said second mixer for amplifying an output of said first filter.

7. A receiver as claimed in claim 1, further comprising an amplifier provided between said second switch and said first mixer for amplifying said output of said second switch.

8. A receiver as claimed in claim 1, further comprising: a first amplifier provided between said first bandpass filter and said second switch for amplifying an output of said first band pass filter and a second amplifier provided between said second bandpass filter and said second switch for amplifying an output of said second band pass filter.

9. A receiver as claimed in claim 8, further comprising a third filter for filtering an output of said first amplifier and a fourth filter for filtering an output of said second amplifier.

10. A receiver as claimed in claim 1, further comprising an amplifier provided between said first filter and said second mixer for amplifying an output of said first filter.

11. A receiver as claimed in claim 1, further comprising a second input terminal for receiving a second radio wave signal including at least one of said first and second radio wave components from another antenna, and a fourth switch for supplying either of said radio wave signal or said second radio wave signal to said first switch in response to an antenna switching signal, wherein the supplying either of said radio wave signal or said second radio wave provides a diversity receiving.

12. A receiver as claimed in claim 11, further comprising an amplifier provided between said second switch and said first mixer for amplifying said output of said second switch.

13. A receiver as claimed in claim 11, further comprising a first amplifier provided between said first bandpass filter and said second switch for amplifying an output of said first band pass filter, and a second amplifier provided between said second bandpass filter and said second switch for amplifying an output of said second band pass filter.

14. A receiver as claimed in claim 13, further comprising a third filter for filtering an output of said first amplifier and a fourth filter for filtering an output of said second amplifier.

15. A receiver as claimed in claim 11, further comprising an amplifier provided between said first filter and said second mixer for amplifying an output of said first filter.

16. A receiver as claimed in claim 11, further comprising a fifth switch for supplying said first oscillation signal to said third switch in said first mode and to said third mixer in said second mode and a sixth switch for supplying a supply power to said third mixer in said second mode.

17. A receiver as claimed in claim 16, further comprising an amplifier provided between said second switch and said first mixer for amplifying said output of said second switch.

18. A receiver as claimed in claim 16, further comprising a first amplifier provided between said first bandpass filter and said second switch for amplifying an output of said first band pass filter, and a second amplifier provided between said second bandpass filter and said second switch for amplifying an output of said second band pass filter.

19. A receiver as claimed in claim 18, further comprising a third filter for filtering an output of said first amplifier and a fourth filter for filtering an output of said second amplifier.

20. A receiver as claimed in claim 16, further comprising an amplifier provided between said first filter and said second mixer for amplifying an output of said first filter.

21. A receiver comprising:
a first local oscillator for generating first and second local oscillation signals in first and second modes respectively;
a second local oscillator for generating a third local oscillation signal; and
first and second receiving circuits, each including:
an input terminal for receiving a radio wave signal including at least one of first and second radio wave components from an antenna;
a first switch;

a first band pass filter for band-pass-filtering said radio wave signal from said first switch and extracting said first radio wave component;

a second band pass filter for band-pass-filtering said radio wave signal from said first switch and extracting said second radio wave component;

a second switch, said first and second switch selectively forming first and second signal passages through said first band pass filter in said first mode and said second band pass filter in said second mode respectively;

a first mixer for mixing an output of said second switch with said first and second local oscillation signals in said first and second modes respectively;

a first filter for filtering an output of said first mixer to output first and second intermediate frequency signals in said first and second modes, respectively, said first and second local oscillation signal being generated such that said first and second intermediate frequency signals have the same intermediate frequency;

a second mixer for mixing an output of said first filter with said third local oscillation signal; and a second filter for filtering an output of said second mixer to output third and fourth intermediate frequency signals in said first and second modes, respectively, wherein said second filters of said first and second receiving circuits provides output intermediate frequency signals of diversity receiving, wherein said first local oscillator comprises a first frequency synthesizer for generating said first local oscillation signal, a third mixer for mixing said first oscillation signal with said third local oscillation signal to provide said second oscillation signal, and a third switch for outputting said first and second local oscillation signals in said first and second modes respectively.

22. A receiver as claimed in claim 21, wherein each of said receiving circuits further comprising a first amplifier provided between said first bandpass filter and said second switch for amplifying an output of said first band pass filter and a second amplifier provided between said second bandpass filter and said second switch for amplifying an output of said second band pass filter.

23. A receiver as claimed in claim 22, wherein each of said receiving circuits further comprises: a third filter for filtering an output of said first amplifier and a fourth filter for filtering an output of said second amplifier.

24. A receiver as claimed in claim 21, wherein each of said receiving circuit further comprises: an amplifier provided between said second switch and said first mixer for amplifying said output of said second switch.

25. A receiver as claimed in claim 22, wherein each of said receiving circuits, further comprises an amplifier provided between said first filter and said second mixer for amplifying an output of said first filter.

26. A receiver as claimed in claim 21, further comprising a fourth switch for supplying said first oscillation signal to said third switch in said first mode and to said third mixer in said second mode and a fifth switch for supplying a supply power to said third mixer in said second mode.

27. A receiver as claimed in claim 26, wherein each of said receiving circuits further comprises a first amplifier provided between said first bandpass filter and said second switch for amplifying an output of said first band pass filter and a second amplifier provided between said second bandpass filter and said second switch for amplifying an output of said second band pass filter.

28. A receiver as claimed in claim 26, wherein each of said receiving circuits further comprises an amplifier provided between said second switch and said first mixer for amplifying said output of said second switch.

29. A receiver as claimed in claim 26, wherein each of said receiving circuits further comprises a third filter for filtering an output of said first amplifier and a fourth filter for filtering an output of said second amplifier.

30. A receiver as claimed in claim 26, wherein each of said receiving circuits further comprises an amplifier provided between said first filter and said second mixer for amplifying an output of said first filter.

31. A receiver comprising;

a first input terminal for receiving a first radio wave signal including at least one of first and second radio wave components from an antenna;

a first switch receiving said first radio wave signal from said first input terminal;

a second input terminal for receiving a second radio wave signal including at least one of said first and second radio wave components from another antenna;

a second switch receiving said second radio wave signal from said second input terminal;

a first band pass filter for band-pass-filtering said first radio wave signal from said first switch and extracting said first radio wave component in a first mode;

a third switch receiving said first and second radio wave signals from said first and second switches in second mode and outputting either of said first or second radio wave signal in response to an antenna switching signal in said second mode;

a second band pass filter for band-pass-filtering an output of said third switch and extracting said second radio wave component;

a fourth switch, said first and fourth switches forming a first passage through said first band pass filter in said first mode, said third and fourth switch forming a second passage through said second band pass filter in a second mode;

a first local oscillator for generating first and second local oscillation signals in said first and second modes respectively;

a first mixer for mixing an output of said fourth switch with said first and second local oscillation signals in said first and second modes respectively;

a first filter for filtering an output of said first mixer to output first and second intermediate frequency signals in said first and second modes, respectively, said first and second local oscillation signal being generated such that said first and second intermediate frequency signals have the same intermediate frequency;

a second local oscillator for generating a third local oscillation signal;

a second mixer for mixing an output of said first filter with said third local oscillation signal; and a second filter for filtering an output of said second mixer to output third and fourth intermediate frequency signals in said first and second modes, respectively;

a third band pass filter for band-pass-filtering said second radio wave signal from said second switch and extracting said first radio wave component, said second switch supplying said second radio wave signal to said third band pass filter in said first mode;

a third mixer for mixing an output of said third band pass filter with said first local oscillation signal in said first mode;

a third filter for filtering an output of said third mixer to output third intermediate frequency signal in said first mode;

a fourth mixer for mixing an output of said third filter with said third local oscillation signal; and a fourth filter for filtering an output of said fourth mixer to output a fourth intermediate frequency signal in said first mode.

32. A receiver as claimed in claim 18, wherein said first local oscillator comprises a first frequency synthesizer for generating said first local oscillation signal, a fifth mixer for mixing said first local oscillation signal with said third local oscillation signal to provide said second oscillation signal, and a fifth switch for outputting said first and second local oscillation signals in said first and second modes respectively, a sixth switch for supplying said first local oscillation signal to said fifth switch in said first mode and to said fifth mixer in said second mode, and a seventh switch for supplying a supply power to said fifth mixer in said second mode.

33. A receiver as claimed in claim 31 wherein said first local oscillator comprises a first frequency synthesizer for generating said first local oscillation signal, a fifth mixer for mixing said first oscillation signal with said third local oscillation signal to provide said second oscillation signal, and a fifth switch for outputting said first and second local oscillation signals in said first and second modes respectively.

\* \* \* \* \*